(12) United States Patent
Liang et al.

(10) Patent No.: US 11,869,916 B2
(45) Date of Patent: Jan. 9, 2024

(54) BOND PAD STRUCTURE FOR BONDING IMPROVEMENT

(71) Applicant: Taiwan Semiconductor Manufacturing Co., Ltd., Hsin-Chu (TW)

(72) Inventors: Chin-Wei Liang, Zhubei (TW); Sheng-Chau Chen, Tainan (TW); Hsun-Chung Kuang, Hsinchu (TW); Sheng-Chan Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 307 days.

(21) Appl. No.: 17/097,360

(22) Filed: Nov. 13, 2020

(65) Prior Publication Data

US 2022/0157875 A1   May 19, 2022

(51) Int. Cl.
 *H01L 27/146*   (2006.01)
(52) U.S. Cl.
 CPC .... *H01L 27/14636* (2013.01); *H01L 27/1462* (2013.01); *H01L 27/14685* (2013.01); *H01L 27/14698* (2013.01)
(58) Field of Classification Search
 CPC .......... H01L 27/14636; H01L 27/1462; H01L 27/14685; H01L 27/14698; H01L 2224/05; H01L 2224/48463; H01L 27/14683; H01L 27/14632; H01L 27/1464; H01L 27/14643; H01L 27/14687; H01L 27/14689; H01L 27/14806
See application file for complete search history.

(56) References Cited

U.S. PATENT DOCUMENTS

| | | | |
|---|---|---|---|
| 8,435,824 B2 | 5/2013 | Tsai et al. | |
| 8,866,250 B2 * | 10/2014 | Ting | H01L 27/14636 438/70 |
| 9,230,941 B2 | 1/2016 | Chen et al. | |
| 10,181,491 B2 | 1/2019 | Chen et al. | |
| 2008/0173792 A1 | 7/2008 | Yang et al. | |
| 2013/0009270 A1 | 1/2013 | Tsai et al. | |
| 2016/0379960 A1 * | 12/2016 | Huang | H01L 27/14636 257/432 |

(Continued)

FOREIGN PATENT DOCUMENTS

CN   108281494 A   7/2018

*Primary Examiner* — Jonathan Han
(74) *Attorney, Agent, or Firm* — Eschweiler & Potashnik, LLC

(57) ABSTRACT

A method of fabricating a semiconductor device includes receiving a device substrate; forming an interconnect structure on a front side of the device substrate; and etching a recess into a backside of the device substrate until a portion of the interconnect structure is exposed. The recess has a recess depth and an edge of the recess is defined by a sidewall of the device substrate. A conductive bond pad is formed in the recess, and a first plurality of layers cover the conductive bond pad, extend along the sidewall of the device substrate, and cover the backside of the device substrate. The first plurality of layers collectively have a first total thickness that is less than the recess depth. A first chemical mechanical planarization is performed to remove portions of the first plurality of layers so remaining portions of the first plurality of layers cover the conductive bond pad.

20 Claims, 7 Drawing Sheets

(56) References Cited

U.S. PATENT DOCUMENTS

| | | | |
|---|---|---|---|
| 2017/0047301 A1 | 2/2017 | Yang et al. | |
| 2017/0133429 A1* | 5/2017 | Cheng | H01L 27/14687 |
| 2017/0186799 A1 | 6/2017 | Lin et al. | |
| 2017/0229494 A1 | 8/2017 | Hsu et al. | |
| 2017/0301715 A1* | 10/2017 | Cheng | H01L 27/14632 |
| 2018/0315789 A1 | 11/2018 | Takahashi et al. | |
| 2020/0058549 A1 | 2/2020 | Choi et al. | |

* cited by examiner

BOND PAD STRUCTURE FOR BONDING IMPROVEMENT

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a conductive bond pad) often have separate requirements than other features of an IC. For example, a conductive bond pad must have sufficient size and strength to withstand physical contact due to such actions as probing or wire bonding. There is often a simultaneous desire to make features relatively small (both in size and in thickness). However, as features become smaller and thinner, distortions in the wafer, such as bending or bowing, make manufacturing of the features more and more difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
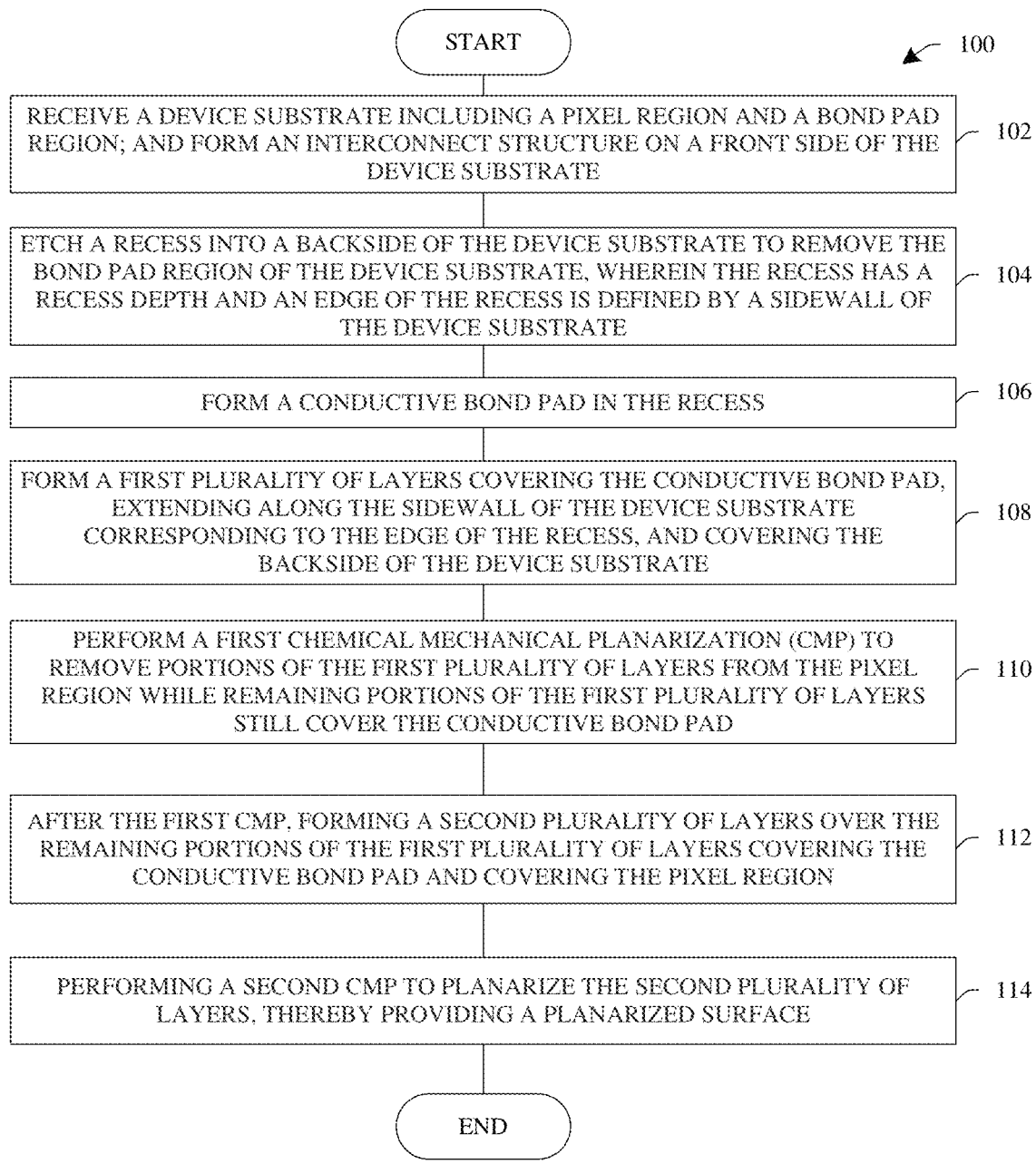
FIG. 1 illustrates a flowchart of some embodiments of a method for manufacturing a 3DIC having a front-side illuminated sensor with an improved bond pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs), such as backside illuminated (BSI) ICs and front-side illuminated (FSI) ICs, have bond pad structures by which they are coupled to printed circuit boards, etc. Some aspects of the present disclosure lie in the appreciation that previous bond pad approaches may result in substrate bowing, warpage or "cupping", whereby layers formed on one side of a substrate induce strains or stresses that tend to deform the wafer. This bowing makes patterning small features very difficult, for example to the focus depth and/or resolution of photolithography tools, among others.

Accordingly, the present disclosure relates to improved methods and bond pad structures that provide substrates with less bowing than previous approaches.

FIG. 1 is a flowchart of a method 100 for making a semiconductor structure having one or more backside illuminated sensors (BSIs) in accordance with some embodiments. The method 100 begins with step 102 in which a device substrate, which includes a pixel region and a bond pad region, is received, and an interconnect structure is formed on a front side of the device substrate. The method 100 continues with step 104 in which a recess is etched into a backside of the device substrate to remove the bond pad region of the device substrate until a portion of the interconnect structure is exposed. The recess has a recess depth and an edge of the recess is defined by a sidewall of the device substrate. The method 100 continues with step 106 in which a conductive bond pad, for example a metal bond pad, is formed in the recess. The method 100 continues at step 108 in which a first plurality of layers are formed. The first plurality of layers cover the conductive bond pad, extend along the sidewall of the device substrate corresponding to the edge of the recess, and cover the backside of the device substrate. Each of the first plurality of layers is substantially conformal and collectively have a first total thickness that is less than the recess depth—thus, the first plurality of layers only partially fill the recess. The first plurality of layers induce "bow" or "bend" into the device substrate due to tensile strain or other stresses arising from their formation. The method 100 continues at step 110 in which a first chemical mechanical planarization (CMP) is performed to remove portions of the first plurality of layers from the pixel region while remaining portions of the first plurality of layers still cover the conductive bond pad. This first CMP cuts off the upper portions of the first plurality of layers, thereby reducing strain/stress due to the first plurality of layers. The method 100 continues at step 112 in which a second plurality of substrate-bowing layers are formed over the remaining portions of the first plurality of layers covering the conductive bond pad and covering the pixel region. The method continues in step 114 in which a second CMP is performed to planarize the second plurality of substrate-bowing layers, thereby providing a planarized surface. Although the second plurality of layers again apply stress/ strain that can bow the substrate, because the first plurality of layers have been "cut off" by the first CMP and the second plurality of layers are "thin" (and also have upper regions that are "cut off" by the second CMP), this approach provides reduced bowing compared to other approaches. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2 to 12 are diagrammatic sectional side views of one embodiment of a semiconductor structure that is a back-side illuminated (BSI) image sensor device 200 at various stages of fabrication according to the method 100 of FIG. 1. The image sensor device 200 comprises pixels (sensors) for sensing and recording an intensity of radiation (such as light) directed toward a back-side of the image sensor device 200. The image sensor device 200 may comprise a complimentary metal oxide semiconductor (CMOS) image sensor (CIS), a charge-coupled device (CCD), an active-pixel sensor (APS), or a passive-pixel sensor. The image sensor device 200 further comprises additional circuitry and input/outputs that are provided adjacent to the sensors for providing an operation environment for the sensors and for supporting external communication with the sensors. It is understood that FIGS. 2 to 12 have been simplified for a better understanding of the inventive concepts of the present disclosure and may not be drawn to scale.

Figure 2:
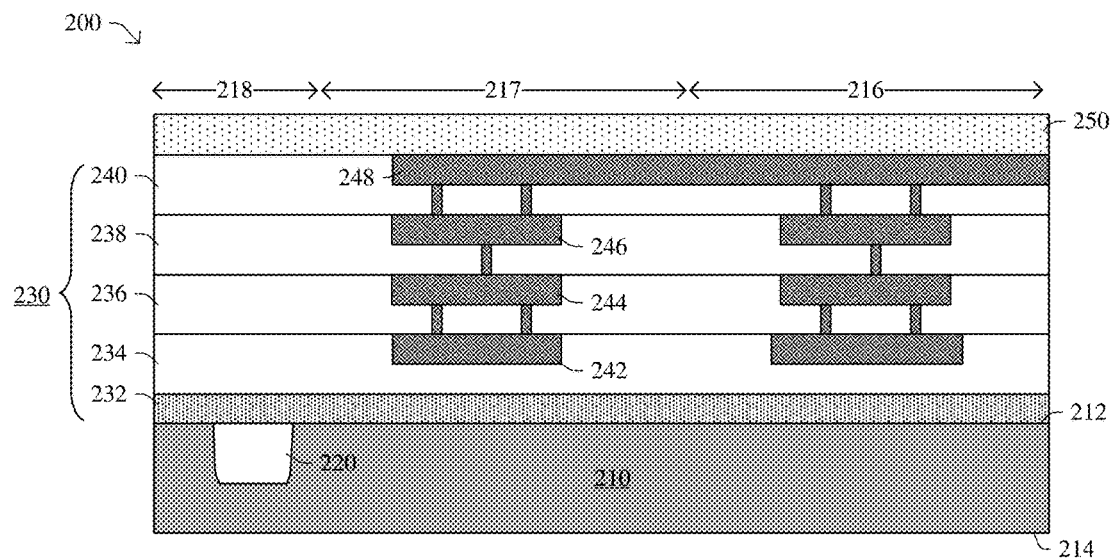
FIGS. 2-11 illustrate a series of cross-sectional views that collectively illustrate an example manufacturing flow consistent with some embodiments of the method of FIG. 1.

With reference to FIG. 2, the BSI image sensor device 200 comprises a device substrate 210, and can be consistent with some embodiments of 102 of FIG. 1. The device substrate 210 has a front side 212 and a back side 214. The device substrate 210 is a silicon substrate doped with a p-type dopant such as boron (for example a p-type substrate). Alternatively, the device substrate 210 could comprise another suitable semiconductor material. For example, the device substrate 210 may be a silicon substrate that is doped with an n-type dopant such as phosphorous or arsenic (an n-type substrate). The device substrate 210 could comprise other elementary materials such as germanium or indium, among others. The device substrate 210 could optionally comprise a compound semiconductor and/or an alloy semiconductor. Further, the device substrate 210 could comprise an epitaxial layer (epi layer), may be strained for performance enhancement, and may comprise a silicon-on-insulator (SOI) structure.

The device substrate 210 comprises a bonding region 216, a logic region 217, and a radiation-sensing region 218. The radiation-sensing region 218 is a region of the device substrate 210 where radiation-sensing devices will be formed. The radiation-sensing region 218, for example, comprises (radiation) sensor 220. The sensor 220 is operable to sense radiation, such as an incident light (thereafter referred to as light), that is projected toward the back side 214 of the device substrate 210, therefore referred to as back side illumination (BSI) sensor. The sensor 220 comprises a photodiode in the present embodiment. Other examples of the sensor 220 may comprise pinned layer photodiodes, photogates, a complimentary metal-oxide-semiconductor (CMOS) image sensor, a charged coupling device (CCD) sensor, an active sensor, a passive sensor, and/or other types of devices diffused or otherwise formed in the semiconductor substrate 210. As such, the sensors 220 may comprise conventional and/or future-developed image sensing devices. The sensor 220 may additionally comprise reset transistors, source follower transistors, and transfer transistors. Further, the sensor 220 may be varied from one another to have different junction depths, thicknesses, and so forth. For the sake of simplicity, only sensor 220 is illustrated in FIG. 2, but it is understood that any number of sensors may be implemented in the device substrate 210. Where more than one sensor is implemented, the radiation-sensing region comprises isolation structures that provide electrical and optical isolation between the adjacent sensors. The logic region 217 is a region where one or more logic devices, such as transistors, are disposed in the substrate. The bonding region 216 is a region where one or more metal bond pads of the BSI image sensor device 200 will be formed in a later processing stage, so that electrical connections between the BSI image sensor device 200 and external devices may be established. It is also understood that regions 216, 217, and 218 extend vertically above and below the device substrate 210.

Still referring to FIG. 2, an interconnect structure 230 is formed over the front side of the device substrate 210. The interconnect structure 230 comprises a plurality of conductive layers embedded in dielectric material layers. The plurality of conductive layers provide interconnections between the various doped features, circuitry, and input/output of the image sensor device 200. The plurality of conductive layers comprise metal lines in metal one, metal two and so on to the top-most layer. The plurality of conductive layers further comprise contacts for coupling the doped regions to the metal lines in metal one. The plurality of conductive layers further comprise vias to couple adjacent metal layers. In the present embodiment, the interconnect structure 230 comprises an interlayer dielectric (ILD) layer 232 and a plurality of intermetal dielectric (IMD) layers 234, 236, 238, and 240. The ILD layer 232 and the plurality of intermetal dielectric (IMD) layers 234, 236, 238, and 240 layers may comprise suitable dielectric material. For example, in the present embodiments, the ILD layer 232 and the plurality of intermetal dielectric (IMD) layers 234, 236, 238, and 240 comprises a low dielectric constant (low-k) material, the material having a constant lower than that of thermal silicon oxide. In other embodiments, the ILD layer 232 and the plurality of intermetal dielectric (IMD) layers 234, 236, 238, and 240 comprises a dielectric material. The dielectric material may be formed by CVD, HDPCVD, PECVD, combinations thereof, or other suitable processes.

Each of the IMD layers 234, 236, 238, and 240 comprises contacts, vias and a metal layer 242, 244, 246, and 248, respectively. For the purposes of illustration, only four IMD layers are shown in FIG. 2, it being understood that any number of IMD layers may be implemented and that the IMD layers as illustrated are merely exemplary, and the actual positioning and configuration of the metal layers and vias/contacts may vary depending on design needs.

The interconnect structure 230 may comprise conductive materials such as aluminum, aluminum/silicon/copper alloy, titanium, titanium nitride, tungsten, polysilicon, metal silicide, or combinations thereof, formed by a process including physical vapor deposition, CVD, HDPCVD, PECVD, combinations thereof, or other suitable processes. Other manufacturing techniques to form the interconnect may comprise photolithography processing and etching to pattern the conductive materials for vertical connection (for example, vias/contacts) and horizontal connection (for example, metal layers). Alternatively, a copper multilayer interconnect may be used to form the metal patterns. The copper interconnect structure may comprise copper, copper alloy, titanium, titanium nitride, tantalum, tantalum nitride, tungsten, polysilicon, metal silicide, or combinations thereof. The copper interconnect may be formed by damascene techniques including dielectric deposition, etching, deposition and polishing. The deposition may comprise sputtering, plating, CVD or other suitable processes.

Still referring to FIG. 2, in the present embodiment, a passivation layer 250 is formed over the interconnect structure 230 and in direct contact with the nth metal layer 248. The passivation layer 250 may comprise any suitable dielectric material. In the present embodiment, the passivation layer 250 comprises silicon oxide, silicon nitride, silicon oxynitride or combinations thereof. The passivation layer 250 may be formed by a suitable technique, such as CVD. The passivation layer 250 may be planarized to form a smooth surface by a chemical mechanical polishing (CMP) process.

Figure 3:
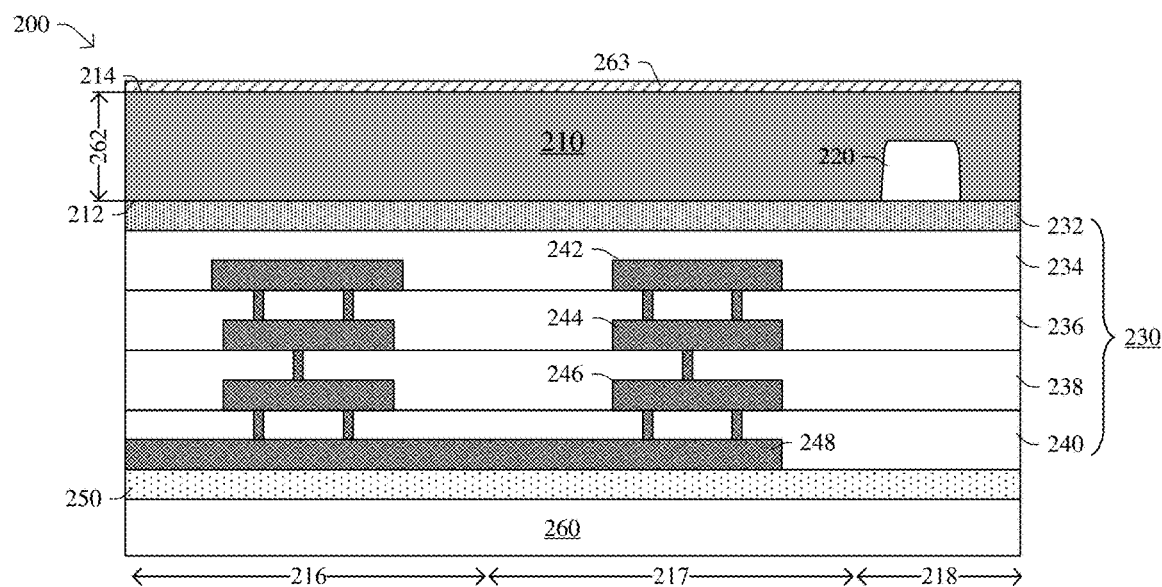

With reference to FIG. 3, a carrier substrate 260 is bonded with the device substrate 210 from the front side, so that processing the back side 214 of the device substrate 210 can be performed. The carrier substrate 260 in the present embodiment comprises a silicon material. Alternatively, the carrier substrate 260 may comprise a glass substrate or another suitable material. The carrier substrate 260 may be bonded to the device substrate 210 by molecular forces—a technique known as direct bonding or optical fusion bonding—or by other bonding techniques known in the art, such as metal diffusion, eutectic bonding, or anodic bonding. The passivation layer 250 provides electrical isolation from the carrier substrate 260. The carrier substrate 260 provides protection for the various features formed on the front side 212 of the device substrate 210, such as the sensor 220. The carrier substrate 260 also provides mechanical strength and support for processing the back side 214 of the device substrate 210.

After bonding, the device substrate 210 and the carrier substrate 260 may optionally be annealed to enhance bonding strength. A thinning process is performed to thin the device substrate 210 from the back side 214. The thinning process may comprise a mechanical grinding process and a chemical thinning process. A substantial amount of substrate material may be first removed from the device substrate 210 during the mechanical grinding process. Afterwards, the chemical thinning process may apply an etching chemical to the back side 214 of the device substrate 210 to further thin the device substrate 210 to a thickness 262. In one example, the thickness 262 of the device substrate 210 is in the range of about 6 microns to about 10 microns, and is about 6 microns in some embodiments. It is also understood that the particular thicknesses disclosed in the present disclosure serves as a mere example and that other thicknesses may be implemented depending on the type of application and design requirements of the image sensor device 200.

Still referring to FIG. 3, one or more material layers may be formed on the back side 214 of the device substrate 210. In one example, a mask layer 263, which may include a hard mask, an antireflective coating (ARC) layer, and/or a photoresist layer, may be formed over the back side 214 of the device substrate 210. In some embodiments, the mask layer 263 can include a nitride, such as silicon nitride or silicon oxynitride, with a higher structural integrity than the low-k dielectric material of the IMD layers. Because of this higher structural integrity, as will be appreciated in greater detail below, the mask layer 263 can act as a CMP stop at some stages in the manufacturing process.

Figure 4:
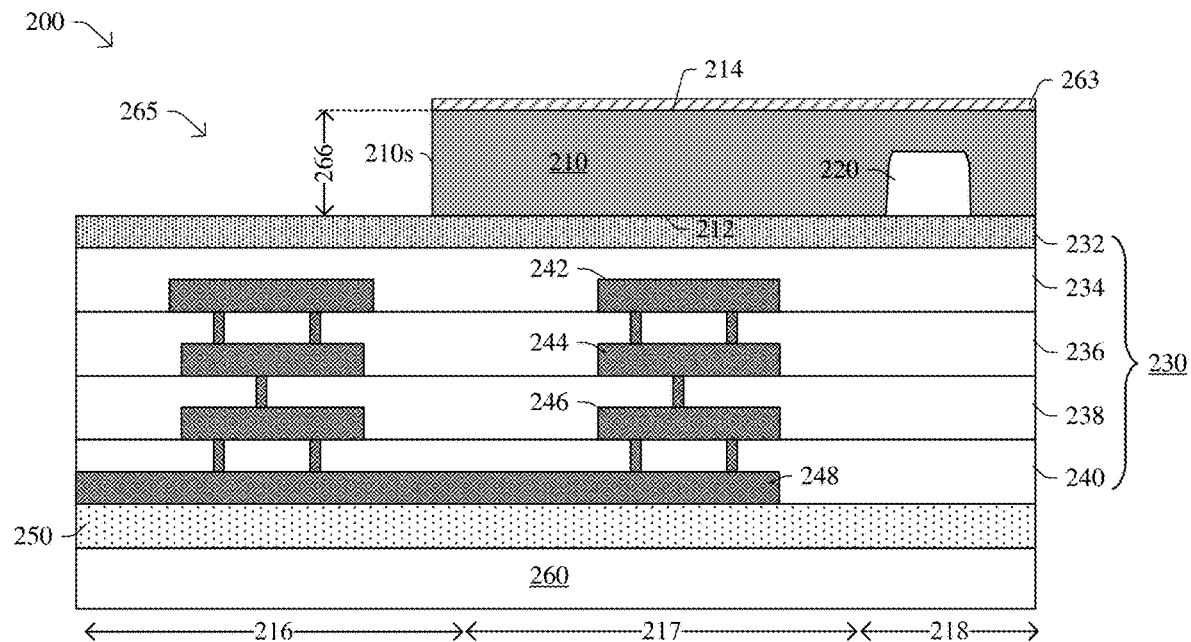

FIG. 4 illustrates patterning the device substrate 210 by removing the bond pad region 216 of the device substrate 210 to form a recess 265 in the backside 214 of the device substrate 210, according to an embodiment of the present disclosure. Thus, FIG. 4 can correspond to some embodiments of step 104 in FIG. 1. In some embodiments, the recess 265 extends through an entire thickness of the device substrate 210, and exposes a portion of the interconnect structure 230. Thus, the recess 265 has a recess depth 266, which can be greater than or equal to the device substrate thickness 262, and an edge of the recess is defined by a sidewall 210s of the device substrate 210. The patterning of the device substrate 210 comprises a lithography patterning process. An exemplary photolithography process may comprise photoresist patterning, etching, and photoresist stripping. The photoresist patterning may further comprise processing steps of photoresist coating, soft baking, mask aligning, exposing pattern, post-exposure baking, developing photoresist, and hard baking. Photolithography patterning may also be implemented or replaced by other proper methods such as maskless photolithography, electron-beam writing, ion-beam writing, and molecular imprint. Alternatively, the recess 265 may extend through at least a portion of the interconnect structure 230 such that a dielectric layer, such as ILD layer 232 or IMD layer 234, 236, 238, or 240; or a metal layer, such as the metal one layer 242, metal two layer 244, the metal three layer 246, or the top metal layer 248, is exposed within the recess 265.

In one embodiment, a patterned masking layer 263' is formed by exposing selected regions of a photoresist layer, which is disposed over a hard mask layer, to light, and then developing the photoresist layer and etching the hard mask with the developed photoresist layer in place to establish the patterned masking layer 263'. The device substrate 210 is etched in the bonding region 216 using the patterned masking layer 263' as an etch mask. The etching process may comprise any suitable etching technique, such as dry etching. It is understood that the photoresist mask is removed away by wet stripping or plasma ashing after the removal of the material.

Figure 5:
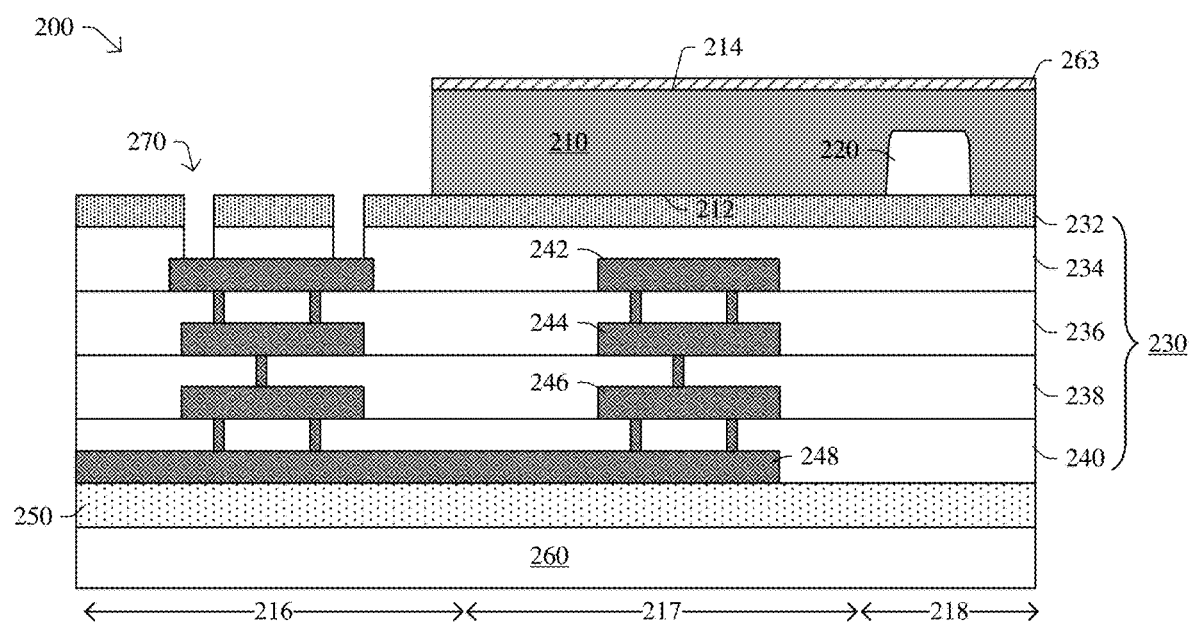

Referring now to FIG. 5, an opening 270 (or recessed region) is formed at the bottom of the recess 265 in the bonding region 216 of the device substrate 210. The opening 270 extends through the ILD 232, reaching a metal feature of the interconnect structure 230, such as a metal feature in the metal one layer of the interconnect structure 230 in the bonding region 216 such that the metal feature is exposed from the back side 214. Alternatively, the opening 270 may extend through at least a portion of the interconnect structure such that a metal layer, such as the metal two layer, the metal three layer, or the top metal layer, is exposed within the opening 270. The opening 270 is formed by an etching process, such as a lithography process and an etching process. The etching process may comprise a suitable technique such as dry etching, wet etching, or a combination thereof. The etching process may comprise multiple etching steps. For example, the etching process comprises a first etching step to effectively etch silicon oxide and a second etching process to effectively etch silicon material.

Figure 6:
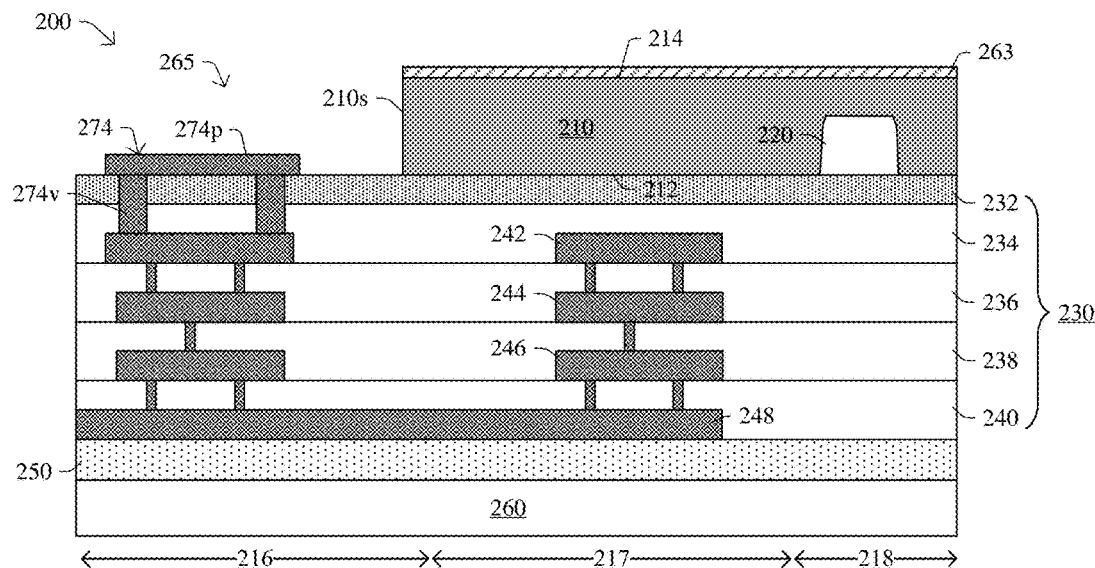

With reference to FIG. 6, a metal bond pad 274 is formed on the device substrate in the bonding region 216. FIG. 6 can correspond to some embodiments of step 106 of FIG. 1. Particularly, the metal bond pad 274 comprises a metal layer, such as aluminum copper alloy or other suitable metal, formed by deposition and patterning. In various examples, the deposition comprises PVD and the patterning comprises lithography process and etching. The metal bond pad 274 partially fills in the opening 270 in the bonding region 216 such that the metal bond pad 274 directly contacts the interconnect structure, such as a metal feature of the metal one layer 242 in the interconnect structure. The metal bond pad 274 includes a plate portion 274p, which is often rectangular or polygonal as viewed from above, and a vertical portion 274v, which may manifest as pillars or a collar-shaped protrusion coupling the plate portion 274p to the underlying metal layer (e.g., 242).

As is illustrated in FIG. 6, the metal bond pad 274 comes into contact with the metal feature of the metal one layer 242 within the opening 270. Therefore, electrical connections between the metal bond pad 274 and device external to the image sensor device 220 may be established through the metal bond pad 274. For the sake of simplicity, only four metal layers (242, 244, 246, and 248) are illustrated, but it is understood that any number of metal layers may be implemented in the interconnect structure 230. It is also understood that the metal bond pad 274 may be extended to contact any metal layer of the interconnect structure, such as the top metal layer.

Figure 7:
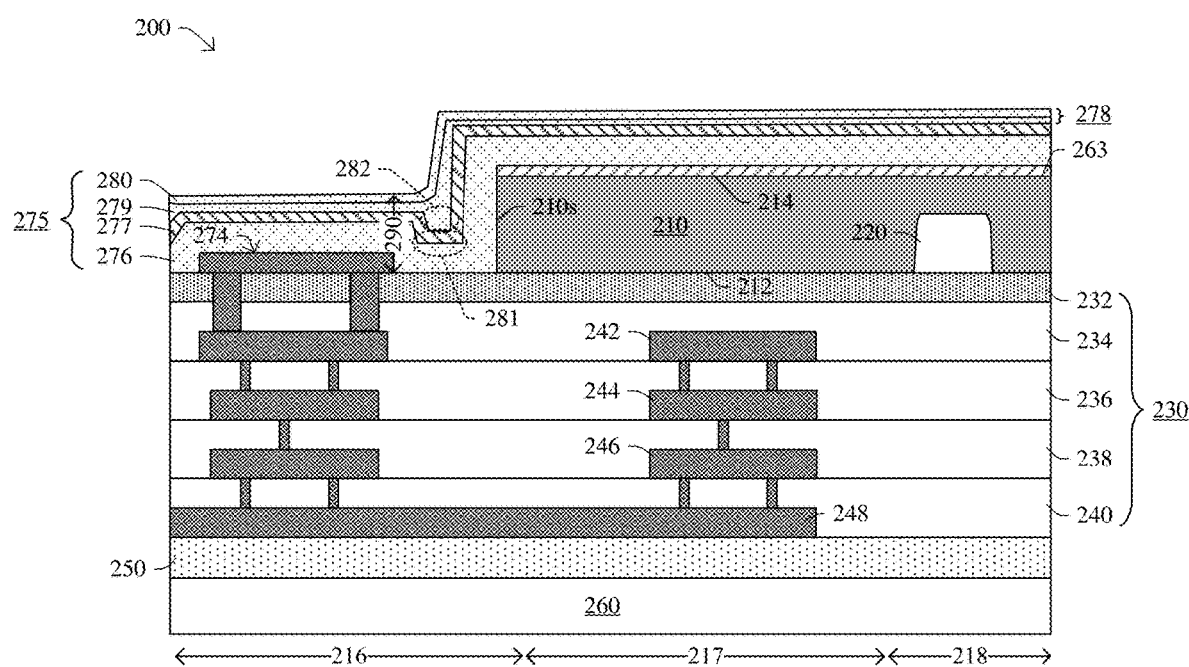

In FIG. 7, a first plurality of layers 275 may be formed over the metal bond pad 274. FIG. 7 can correspond to some embodiments consistent with step 108 of FIG. 1. The first plurality of layers 275 cover the metal bond pad 274, extend along the sidewall 210s of the device substrate corresponding to the edge of the recess 265, and cover the backside 214 of the device substrate 210. The first plurality of layers 275 can induce "bow" or "bend" into the device substrate due to tensile strain or other strains/stresses arising from their formation. The extent of the bow is a function of a total thickness of the first plurality of layers 275 (and/or a total thickness of a subset of the first plurality of layers 275), and thus, to limit this bow, first plurality of layers 275 collectively have a first total thickness 290 that is less than the recess depth (see FIG. 4, 266). For example, the first total thickness can be between 30% of 75% of the recess depth; and in some instances where the recess depth is about 6 microns the first total thickness can range from approximately 2 microns to approximately 5 microns.

In some embodiments, forming the first plurality of layers 275 includes forming a base oxide layer 276, forming a nitride layer 277 over the base oxide layer 276, and forming a first capping oxide layer 278 over the nitride layer 277. The base oxide layer 276 has a base oxide layer thickness and covers the metal bond pad 274, extends along the sidewall 210s of the device substrate 210, and covers the backside of the device substrate. The nitride layer 277 has a nitride layer thickness, which is less than the base oxide layer thickness in some embodiments. The first capping oxide layer 278 has a first capping oxide layer thickness, such that the base oxide layer thickness plus the nitride layer thickness plus the first capping oxide layer thickness is less than the recess depth.

In some embodiments, the base oxide layer 276 is an undoped silicate glass (USG) layer, and the nitride layer 277 is a silicon nitride or silicon oxynitride layer. In some embodiments where the base oxide layer 276 is a USG layer the base oxide layer 276 can have a thickness of about 500 nanometers to about 800 nanometers. The first capping oxide layer 278 can include a first lower capping oxide layer 279 formed by high-density plasma (HDP) and a second lower capping oxide layer 280 comprising USG. In some embodiments, the first lower capping oxide layer 279 can have a thickness of about 2 micrometers to about 4 micrometers; and the second lower capping oxide layer 280 can have a thickness of about 2 micrometers to about 3 micrometers. Because the first, lower capping oxide layer 279 is formed by HDP, the first lower capping oxide layer 279 can apply a first strain per unit thickness that can induce bow into the device substrate, while the second lower capping oxide layer 280 being formed of USG can apply a second strain per unit thickness that can induce bow into the device substrate. The second strain can be less than the first strain. For example, in some embodiments, the first strain can be approximately 100 mega pascals per 1 micron thickness, while the second strain can be approximately 60 mega pascals per 1 micron thickness; and each of the first lower capping oxide layer 279 and the second lower capping oxide layer 280 can have a thickness of about 1 micron in some embodiments.

Each of the first plurality of layers 275 is substantially conformal, such that the base oxide layer 276 extends downwardly along an outer sidewall of the metal bond pad 274, thereby providing a corresponding peripheral recess 281 in an upper surface of the base oxide layer 276. This peripheral recess 281 is adjacent to a vertical portion of the base oxide layer along the sidewall 210s, wherein the vertical portion extends upwardly from a base portion of the base oxide structure. The nitride layer 277 fills the peripheral recess 281, and can also exhibit its own peripheral recess 282 in an upper surface of the nitride layer; and the first capping oxide layer 278 can fill the peripheral recess 282 in the nitride layer and be free of a peripheral recess in its upper surface.

Figure 8:
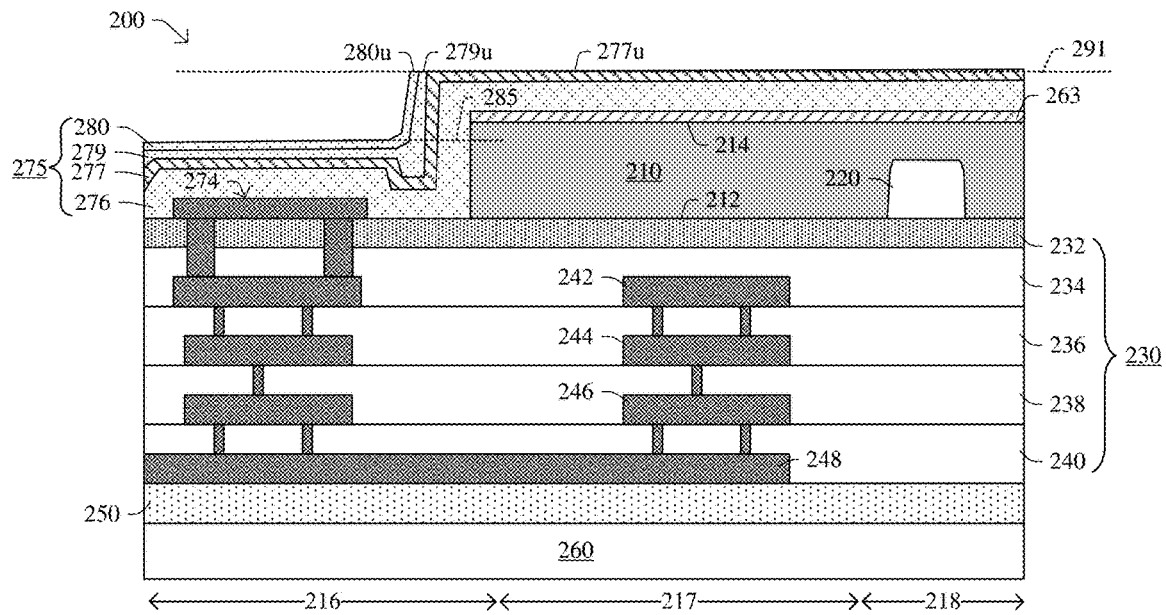

In FIG. 8, a first chemical mechanical planarization (CMP) has been performed on the structure of FIG. 7, with FIG. 8 showing the completed structure after the first CMP. FIG. 8 can correspond to some embodiments consistent with step 110 of FIG. 1. The first CMP removes portions of the first plurality of layers 275 from the pixel region 218 and logic region 217 so remaining portions of the first plurality of layers cover the metal bond pad region 216. In some embodiments, the first CMP stops on an uppermost surface 277u of the nitride layer 277 over the pixel region 218, such that the portions of the first plurality of layers 275 over the metal bond pad 274 remain entirely intact (and remain below backside 214—see line 285). Further, the first CMP cuts off vertical portions of the first lower capping oxide layer 279 and second lower capping oxide layer 280 to have upper surfaces 279u, 280u that are planarized with the upper surface 277u of the nitride layer 277 (see plane 291). By removing the upper portions of the first plurality of layers 275 from the pixel region 218, the first CMP operation reduces the first substrate-bow.

Figure 9:
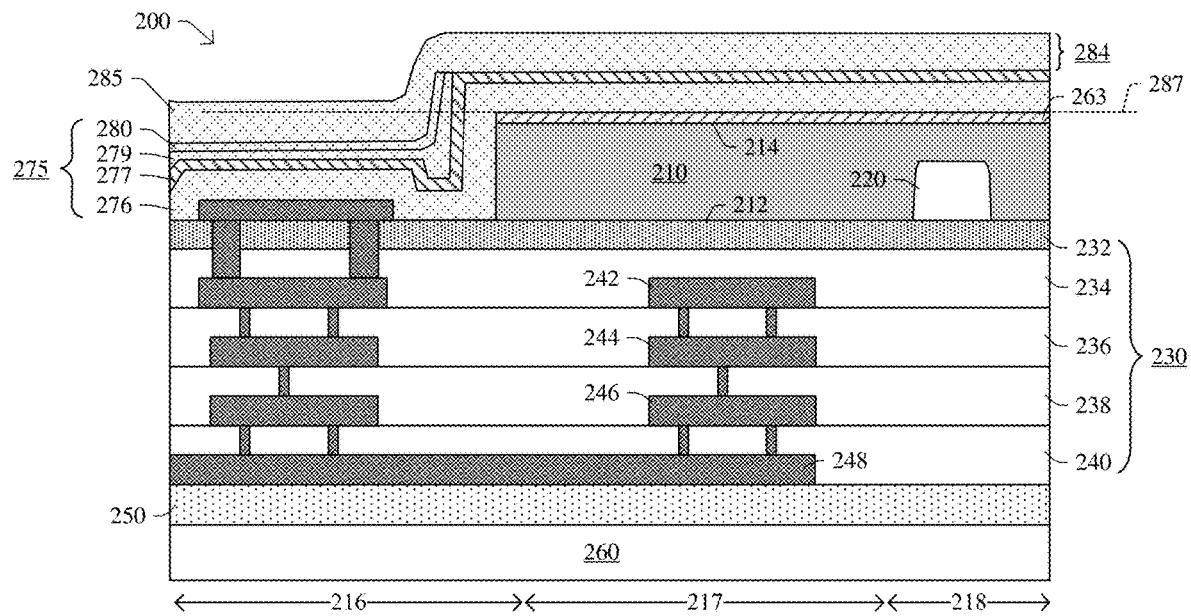

In FIG. 9, a second plurality of layers 284 may be formed. FIG. 9 can correspond to some embodiments consistent with step 112 of FIG. 1. Like the first plurality of layers, the second plurality of layers may induce "bow" or "bend" into the device substrate due to tensile strain or other strains/stresses arising from their formation. In some embodiments, the second plurality of layers comprises a first upper oxide layer 285 that has a sufficient thickness to fill the remainder of the recess such that an upper surface of the first upper oxide layer 285 is higher than an upper surface of the mask layer 263. In some embodiments, the first upper oxide layer 285 comprises USG. In some embodiments, the second plurality of layers 284 can manifest as an USG oxide layer having a thickness of approximately 1 micrometer to about 3 micrometers.

Figure 10:
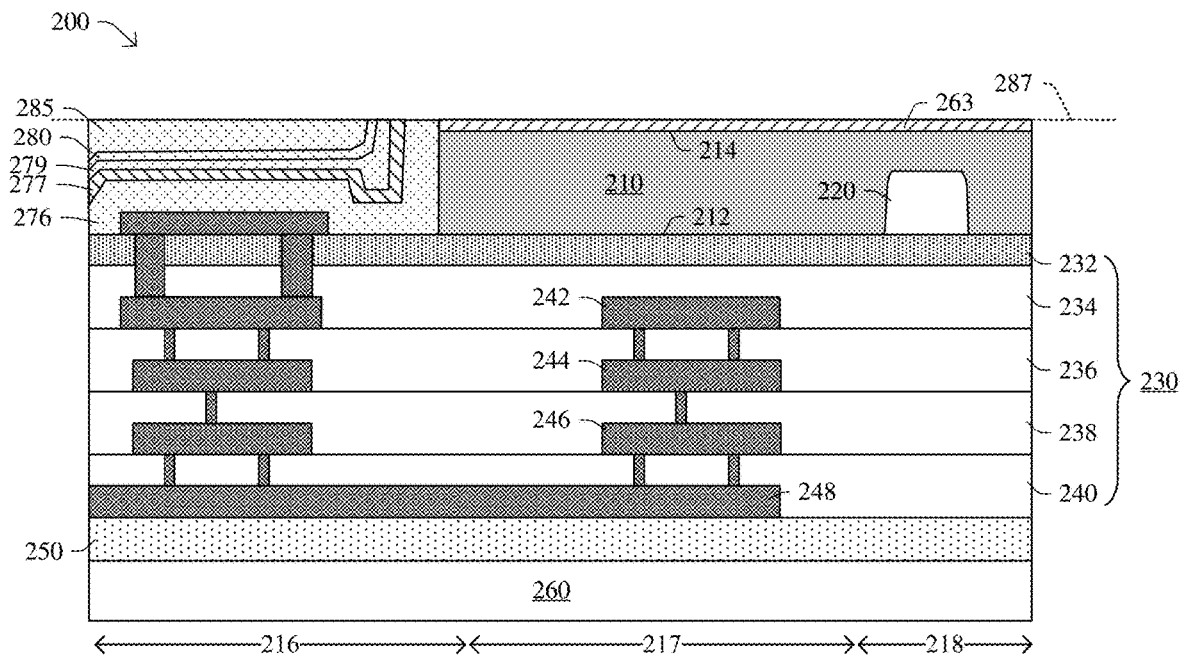

In FIG. 10, a second CMP is performed until a predetermined plane is reached (see e.g., plane 287 in FIG. 9). FIG. 10 can correspond to some embodiments consistent with step 114 of FIG. 1. The second CMP planarizes the second plurality of layers, thereby providing a planarized surface. In some embodiments, the second CMP is performed until the second CMP reaches the upper surface of the mask layer 263 covering the back side 214 of the device substrate, such that the planarized surface of the second plurality of layers is planar with the upper surface of the mask layer 263. Although some dishing may be present on the plane 287, for example, in the range of 100 nm to 200 nm, compared to other approaches bowing is reduced for example to 100 nm to 200 nm, which may be an order of magnitude better than other approaches due to the use of the first and second plurality of layers 275, 284 and first and second CMP operations being used to collectively limit stresses/strains on the device substrate.

Figure 11:
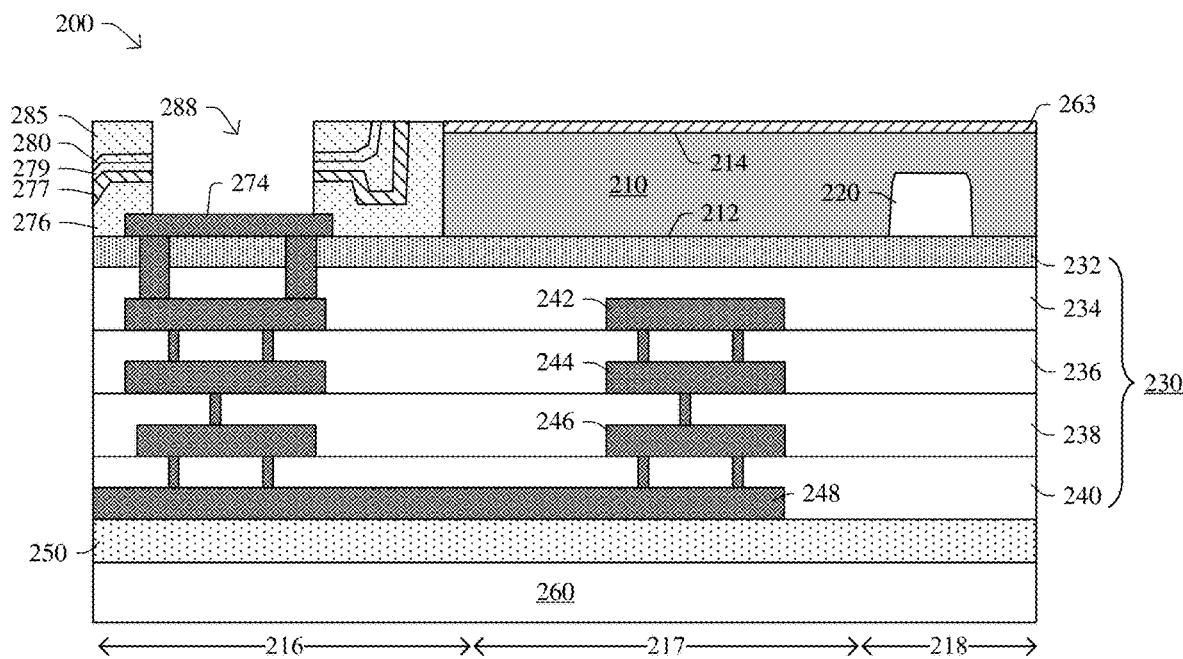

Referring now to FIG. 11, the first and second pluralities of layers are patterned such that at least a portion of the metal bond pad 274 is exposed for a subsequent bonding process. Particularly, at least a portion of the first plurality of layers and second plurality of layers are etched away using a suitable process, defining a pad opening 288 as illustrated in FIG. 11. In some embodiments, the patterning process comprises a lithography process and etching.

Though not illustrated, additional processing is performed to complete the fabrication of the image sensor device 200. For example, color filters are formed within the radiation-sensing region 218. The color filters may be positioned such that light is directed thereon and therethrough. The color filters may comprise a dye-based (or pigment based) polymer or resin for filtering a specific wavelength band of light, which corresponds to a color spectrum (e.g., red, green, and blue). Thereafter, micro-lenses are formed over the color filters for directing and focusing light toward specific radiation-sensing regions in the device substrate 210, such as sensor 220. The micro-lenses may be positioned in various arrangements and have various shapes depending on a refractive index of material used for the micro-lens and distance from a sensor surface. It is also understood that the device substrate 210 may also undergo an optional laser annealing process before the forming of the color filters or the micro-lenses.

Figure 12:
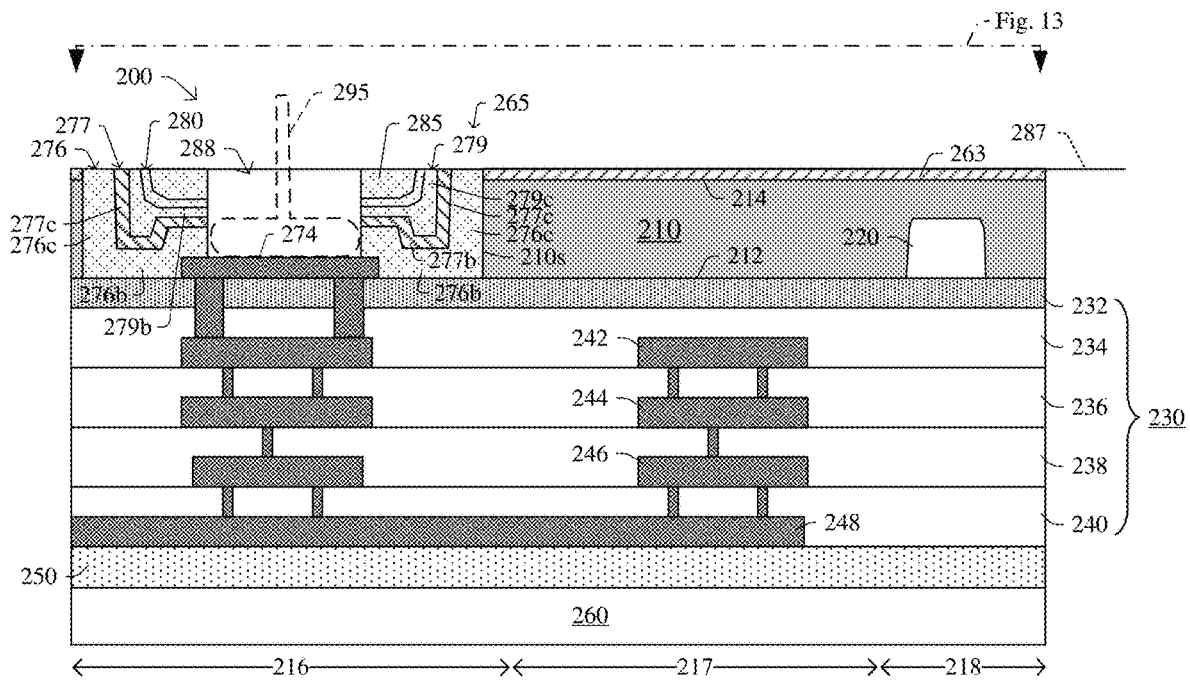
FIG. 12 illustrates a cross-sectional view of some embodiments of a semiconductor device in accordance with some aspects of the present disclosure.
Figure 13:
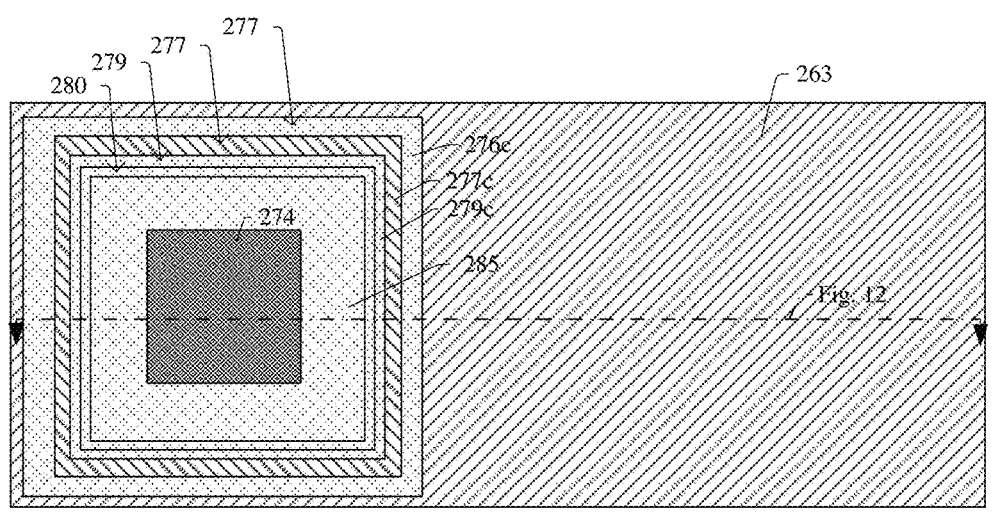
FIG. 13 illustrates a top view of some embodiments consistent with FIG. 12.

FIG. 12 illustrates a cross-sectional view of a semiconductor device 200 in accordance with some embodiments, and FIG. 13 illustrates a top view consistent with some embodiments of FIG. 12. The semiconductor device 200 of FIGS. 12-13 includes a semiconductor substrate 210 having a lower side 212 (e.g., front side) and an upper side 214 (e.g., back side). An interconnect structure 230 is disposed beneath the lower side 212 of the semiconductor substrate, and a carrier substrate 260 is bonded to the interconnect structure 230 such that the interconnect structure 230 is sandwiched between the carrier substrate 260 and the lower side 212 of the semiconductor substrate. A radiation sensor 220 is disposed in the lower side of the semiconductor substrate. The semiconductor substrate 210 includes a bond pad recess 265 that is spaced apart from the radiation sensor 220 and that extends through the semiconductor substrate 210. The bond pad recess 265 is defined by the inner sidewall 210s of the semiconductor substrate. A base oxide structure 276 includes a base portion 276b extending along a lower surface of the bond pad recess and includes a collar portion 276c at an outer edge of the base portion 276b. The collar portion 276c of the base oxide structure extends upwardly along the inner sidewall 210s of the semiconductor substrate. A nitride structure 277 includes a base portion 277b extending along an upper surface of the base portion of the base oxide structure 276 and includes a collar portion 277c at an outer edge of the base portion 277b of the nitride structure. The collar portion 277c of the nitride structure lines inner sidewalls of the collar portion 276c of the base oxide structure. A capping oxide structure 279, 280, and 285 is disposed over an upper surface of the base portion of the nitride structure and lines inner sidewalls of the collar portion of the nitride structure. Each of an upper surface of the collar portion of the base oxide structure, an upper surface of the collar portion of the nitride structure, and an upper surface of the capping oxide structure are planar with one another. A hard mask 263 is disposed over the upper surface of the semiconductor substrate. The hard mask 263 has an upper surface that is co-planar with the upper surface of capping oxide structure (see plane 287).

In some embodiments, the capping oxide structure includes a lower oxide layer 279 including a base portion 279b disposed over the nitride structure and a collar portion 279c at an outer edge of the base portion of the lower oxide structure. The collar portion of the lower oxide layer 279c lines inner sidewalls of the collar portion of the nitride structure. An upper cap structure 280, 285 is disposed over the lower oxide layer. The upper cap structure and the collar portion of the lower oxide layer each have an upper surface that is planar with the upper surface of the hard mask.

An opening 288 can extend through each of the base oxide structure, the nitride structure, and the capping oxide structure, and can terminate at an upper surface of the metal bond pad 274. A bonding ball 295 can land on the upper surface of the metal bond pad 274.

Thus, as can be appreciated from above, some embodiments of the present disclosure relate to a method of fabricating a semiconductor device. In the method, a device substrate including a pixel region and a bond pad region is received. A radiation sensor is formed in the pixel region in a front side of the device substrate. An interconnect structure is formed on the front side of the device substrate, the interconnect structure coupled to the radiation sensor. A recess is etched into a backside of the device substrate to remove the bond pad region of the device substrate until a portion of the interconnect structure is exposed. The recess has a recess depth and an edge of the recess is defined by a sidewall of the device substrate. A metal bond pad is formed in the recess. The metal bond pad is coupled to a metal feature in the interconnect structure. A first plurality of layers are formed to cover the metal bond pad, extend along the sidewall of the device substrate corresponding to the edge of the recess, and cover the backside of the device substrate. Each of the first plurality of layers is substantially conformal and the first plurality of layers collectively have a first total thickness that is less than the recess depth. A first chemical mechanical planarization (CMP) is performed to remove portions of the first plurality of layers from the pixel region so remaining portions of the first plurality of layers cover the metal bond pad.

Other embodiments relate to a semiconductor structure including a semiconductor substrate having a lower side and an upper side. An interconnect structure is disposed beneath the lower side of the semiconductor substrate. A carrier substrate is bonded to the interconnect structure such that the interconnect structure is sandwiched between the carrier substrate and the lower side of the semiconductor substrate. A radiation sensor is disposed in the lower side of the semiconductor substrate. A conductive bond pad is coupled to the radiation sensor through a conductive feature in the interconnect structure. A base oxide structure includes a base portion extending over the conductive bond pad, and a collar portion at an outer edge of the base portion of the base oxide structure. The collar portion of the base oxide structure extends upwardly along the inner sidewall of the semiconductor substrate. A nitride structure includes a base portion extending along an upper surface of the base portion of the base oxide structure and includes a collar portion at an outer edge of the base portion of the nitride structure. The collar portion of the nitride structure lines inner sidewalls of the collar portion of the base oxide structure. A capping oxide structure is disposed over an upper surface of the base portion of the nitride structure and lines inner sidewalls of the collar portion of the nitride structure. Each of an upper surface of the collar portion of the base oxide structure, an upper surface of the collar portion of the nitride structure, and an upper surface of the capping oxide structure are planar with one another.

Still other embodiments relate to a method in which a device substrate is received. An interconnect structure is formed on a front side of the device substrate. A recess is etched into a backside of the device substrate until a portion of the interconnect structure is exposed. The recess has a recess depth and an edge of the recess is defined by an inner sidewall of the device substrate. A metal bond pad is formed in the recess. A first plurality of layers is formed and cover the metal bond pad, extend along the inner sidewall of the device substrate, and cover the backside of the device substrate. The first plurality of layers collectively have a first total thickness that is less than the recess depth. A first chemical mechanical planarization (CMP) is performed to remove uppermost portions of some of the first plurality of layers, thereby leaving some of the first plurality of layers with uppermost planarized surfaces over an edge of the recess and leaving other portions of the first plurality of layers over the metal bond pad intact. The uppermost planarized surfaces are cut to be level with an upper surface of another of the first plurality of layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    receiving a device substrate including a pixel region and a bond pad region;
    forming a radiation sensor in the pixel region in a front side of the device substrate;
    forming an interconnect structure on the front side of the device substrate, the interconnect structure coupled to the radiation sensor;
    etching a recess into a backside of the device substrate to remove the bond pad region of the device substrate until a portion of the interconnect structure is exposed, wherein the recess has a recess depth and an edge of the recess is defined by a sidewall of the device substrate;
    forming a conductive bond pad in the recess, the conductive bond pad coupled to a conductive feature in the interconnect structure;
    forming a first plurality of layers covering the conductive bond pad, extending along the sidewall of the device substrate corresponding to the edge of the recess, and covering the backside of the device substrate, wherein each of the first plurality of layers is substantially conformal and wherein the first plurality of layers collectively have a first total thickness that is less than the recess depth; and
    performing a first chemical mechanical planarization (CMP) to remove portions of the first plurality of layers from the pixel region so remaining portions of the first plurality of layers cover the conductive bond pad;
    wherein the forming of the first plurality of layers induces a first substrate-bow for the device substrate, and performing the first CMP to remove portions of the first plurality of layers from the pixel region reduces the first substrate-bow.

2. The method of claim 1, wherein the first CMP removes a first layer of the first plurality of layers from the pixel region and stops on a second layer of the first plurality of layers covering the pixel region, wherein the first layer has a first structural integrity and the second layer has a second structural integrity that is greater than the first structural integrity.

3. The method of claim 1, further comprising:
    after the first CMP, forming a second plurality of layers over the remaining portions of the first plurality of layers covering the conductive bond pad and covering the pixel region; and
    performing a second CMP to planarize the second plurality of layers, thereby providing a planarized surface on the bond pad region and the pixel region.

4. The method of claim 3, wherein the second CMP is performed until the second CMP reaches a first mask covering the front side of the device substrate, such that the planarized surface of the second plurality of layers is planar with a surface of the first mask.

5. The method of claim 1, wherein forming the first plurality of layers comprises:
    forming a base oxide layer covering the conductive bond pad, extending along the sidewall of the device substrate, and covering the backside of the device substrate, the base oxide layer having a base oxide layer thickness;
    forming a nitride layer over the base oxide layer, the nitride layer having a nitride layer thickness; and
    forming a first capping oxide layer over the nitride layer, the first capping oxide layer having a first capping oxide layer thickness, wherein the base oxide layer thickness plus the nitride layer thickness plus the first capping oxide layer thickness is less than the recess depth.

6. The method of claim 5, wherein the first CMP stops on the nitride layer covering the pixel region such that portions of the base oxide layer, nitride layer, and first capping oxide layer over the conductive bond pad remain entirely intact, and vertical portions of the first capping oxide layer are cut by the first CMP to have upper surfaces that are planarized with an uppermost surface of the nitride layer.

7. The method of claim 6, further comprising:
    after the first CMP, forming a second plurality of layers over the remaining portions of the first plurality of layers over the conductive bond pad, over the vertical portions of the first capping oxide layer, and over the uppermost surface of the nitride layer; and
    performing a second CMP to planarize the second plurality of layers.

8. The method of claim 7, wherein the second CMP is performed until the second CMP reaches a first mask on the front side of the device substrate, such that an uppermost surface of the first plurality of layers and an uppermost surface of the second plurality of layers are planar with an upper surface of the first mask.

9. The method of claim 1, wherein the first plurality of layers comprises:
a first dielectric layer extending directly over an upper surface of the conductive bond pad;
a nitride layer extending directly over an upper surface of the first dielectric layer and directly over the upper surface of the conductive bond pad; and
a second dielectric layer extending directly over an upper surface of the nitride layer and directly over the upper surface of the conductive bond pad.

10. A method comprising:
receiving a device substrate;
forming an interconnect structure on a front side of the device substrate;
etching a recess into a backside of the device substrate until a portion of the interconnect structure is exposed, the recess having a recess depth and an edge of the recess being defined by an inner sidewall of the device substrate;
forming a conductive bond pad in the recess;
forming a first plurality of dielectric layers directly over the conductive bond pad, extending along the inner sidewall of the device substrate, and covering the backside of the device substrate,
forming a second dielectric layer directly over the first plurality of dielectric layers and directly over the conductive bond pad, the second dielectric layer having a material composition that differs from that of the first plurality of dielectric layers and extending along an inner sidewall of the first plurality of dielectric layers, wherein the first plurality of dielectric layers and the second dielectric layer collectively have a first total thickness that is less than the recess depth; and
performing a first chemical mechanical planarization (CMP) to remove uppermost portions of some of the first plurality of dielectric layers, thereby leaving at least one of the first plurality of dielectric layers with an uppermost planarized surface over an edge of the recess and leaving other portions of the first plurality of dielectric layers over the conductive bond pad intact, wherein the uppermost planarized surfaces are cut to be level with an upper surface of another of the first plurality of dielectric layers.

11. The method of claim 10, wherein the first CMP is performed until the first CMP reaches a first mask covering the backside of the device substrate, such that the uppermost planarized surface resulting from the first CMP is planar with a surface of the first mask.

12. The method of claim 10, wherein forming the first plurality of dielectric layers comprises:
forming a base oxide layer covering the conductive bond pad, extending along the inner sidewall of the device substrate, and covering the backside of the device substrate, the base oxide layer having a base oxide layer thickness;
forming a nitride layer over the base oxide layer, the nitride layer having a nitride layer thickness; and
forming a first capping oxide layer over the nitride layer, the first capping oxide layer having a first capping oxide layer thickness, wherein the base oxide layer thickness plus the nitride layer thickness plus the first capping oxide layer thickness is less than the recess depth;
wherein the another of the first plurality of dielectric layers is an uppermost portion of the nitride layer.

13. The method of claim 10, further comprising:
performing a second CMP prior to performing the first CMP, the second CMP removing a second portion of the first plurality of dielectric layers prior to forming the second dielectric layer.

14. A method, comprising:
receiving a semiconductor substrate having a first side and a second side;
forming a radiation sensor in the semiconductor substrate;
forming an interconnect structure on the first side of the semiconductor substrate;
bonding a carrier substrate to the interconnect structure such that the interconnect structure is sandwiched between the carrier substrate and the first side of the semiconductor substrate;
forming a bond pad recess in the semiconductor substrate;
forming a conductive bond pad in the bond pad recess, wherein the conductive bond pad is coupled to the radiation sensor through a conductive feature in the interconnect structure;
forming a base oxide structure over the conductive bond pad, the base oxide structure including: a base portion extending directly over an upper surface of the conductive bond pad, and a collar portion at an outer edge of the base portion of the base oxide structure, the collar portion of the base oxide structure extending upwardly along an inner sidewall of the semiconductor substrate;
forming a nitride structure over the base oxide structure, the nitride structure including a base portion extending directly over an upper surface of the base portion of the base oxide structure and including a collar portion at an outer edge of the base portion of the nitride structure, the collar portion of the nitride structure lining inner sidewalls of the collar portion of the base oxide structure; and
forming a capping oxide structure over the nitride structure, the capping oxide structure disposed directly over an upper surface of the base portion of the nitride structure and lining inner sidewalls of the collar portion of the nitride structure.

15. The method of claim 14, further comprising forming a hard mask over the upper surface of the semiconductor substrate, and forming the bond pad recess with the hard mask in place.

16. The method of claim 15, wherein the capping oxide structure comprises:
a lower oxide layer including a base portion disposed over the nitride structure and a collar portion at an outer edge of the base portion of the lower oxide layer, the collar portion of the lower oxide layer lining inner sidewalls of the collar portion of the nitride structure; and
an upper cap structure disposed over the lower oxide layer, the upper cap structure and the collar portion of the lower oxide layer each having an upper surface that is planar with the upper surface of the hard mask.

17. The method of claim 14, wherein the base oxide structure extends downwardly along an outer sidewall of the conductive bond pad and wherein an upper surface of the base oxide structure includes a peripheral recess adjacent to the collar portion of the base oxide structure, wherein the nitride structure fills the peripheral recess.

18. The method of claim 14, further comprising:
forming an opening extending through each of the base oxide structure, the nitride structure, and the capping oxide structure and terminating at an upper surface of the conductive bond pad.

19. The method of claim 18 further comprising: forming a bonding ball landing on the upper surface of the conductive bond pad.

20. The method of claim 14, wherein a depth of the bond pad recess is approximately 6 microns or less.

* * * * *